(12) United States Patent
Shimokawa et al.

(10) Patent No.: US 7,999,281 B2
(45) Date of Patent: Aug. 16, 2011

(54) OPTICAL SEMICONDUCTOR DEVICE AND METHOD OF MANUFACTURING OPTICAL SEMICONDUCTOR DEVICE

(75) Inventors: Kazuo Shimokawa, Yokohama (JP); Yasunari Ukita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 180 days.

(21) Appl. No.: 11/873,997

(22) Filed: Oct. 17, 2007

(65) Prior Publication Data

US 2009/0224279 A1   Sep. 10, 2009

(30) Foreign Application Priority Data

Oct. 18, 2006  (JP) ................................ P2006-283597

(51) Int. Cl.
*H01L 33/00* (2010.01)
*H01L 23/495* (2006.01)
*H01L 29/06* (2006.01)
*H01L 23/04* (2006.01)
*H01L 21/00* (2006.01)

(52) U.S. Cl. .......... 257/99; 257/622; 257/623; 257/667; 257/676; 257/730; 257/E33.056; 257/E33.057; 257/E33.058; 438/123

(58) Field of Classification Search ............ 257/99, 257/667, 676, 622–623, 730, E33.056–E33.058; 438/123
See application file for complete search history.

(56) References Cited

U.S. PATENT DOCUMENTS

| 6,448,507 B1 * | 9/2002 | Fontecha et al. ............ 174/260 |
| 6,713,849 B2 * | 3/2004 | Hasebe et al. ............... 257/667 |
| 6,853,089 B2 * | 2/2005 | Ujiie et al. ................... 257/783 |
| 7,001,798 B2 * | 2/2006 | Yamaguchi ................... 438/114 |
| 7,164,192 B2 * | 1/2007 | Petty-Weeks et al. ........ 257/667 |
| 7,319,266 B2 * | 1/2008 | St. Germain et al. ......... 257/676 |
| 7,808,089 B2 * | 10/2010 | Nguyen et al. ............... 257/676 |
| 2002/0084518 A1 * | 7/2002 | Hasebe et al. ............... 257/676 |
| 2002/0114577 A1 * | 8/2002 | Kondo et al. ................. 385/51 |
| 2006/0108673 A1 * | 5/2006 | Germain et al. .............. 257/678 |

(Continued)

FOREIGN PATENT DOCUMENTS

JP        2001-352100        12/2001

(Continued)

OTHER PUBLICATIONS

Office Action issued Dec. 14, 2010, in Taiwan Patent Applicaion No. 096137885 (with English Translation).

(Continued)

*Primary Examiner* — Zandra Smith
*Assistant Examiner* — Jeremy J Joy
(74) *Attorney, Agent, or Firm* — Oblon, Spivak, McClelland, Maier & Neustadt, L.L.P.

(57) ABSTRACT

An optical semiconductor device includes: an optical semiconductor element including a light-emitting layer formed on a first principal surface, a first electrode formed on the light-emitting layer and having a smaller size than the first principal surface, and a second electrode formed on a second principal surface different from the first principal surface; a first lead portion including a bonding region to which the first electrode is bonded and which has a smaller size than the first principal surface, and a first groove portion formed on an outer peripheral region adjacent to the bonding region, the first lead portion being electrically connected to the first electrode bonded to the bonding region by use of a bonding member; and a second lead portion electrically connected to the second electrode by use of a connecting member.

12 Claims, 5 Drawing Sheets

U.S. PATENT DOCUMENTS

2007/0278511 A1* 12/2007 Ohno et al. .................. 257/99
2008/0067699 A1* 3/2008 Tamaki .................. 257/787

FOREIGN PATENT DOCUMENTS

| | | | |
|---|---|---|---|
| JP | 2001352100 A | * | 12/2001 |
| JP | 2002-076373 | | 3/2002 |
| JP | 2006-66670 | | 3/2006 |
| JP | 2006-080141 | | 3/2006 |
| JP | 2006-156538 | | 6/2006 |
| JP | 2006156538 A | * | 6/2006 |
| TW | 200534517 | | 10/2005 |
| WO | WO 2004/077630 | | 9/2004 |
| WO | WO 2005/091383 | | 9/2005 |
| WO | WO 2005/091383 A1 | | 9/2005 |
| WO | WO 2005091383 A1 | * | 9/2005 |

OTHER PUBLICATIONS

Office Action issued Jan. 4, 2011, in Japan Patent Application No. 2006-283597 (with English Translation).

* cited by examiner

OPTICAL SEMICONDUCTOR DEVICE AND METHOD OF MANUFACTURING OPTICAL SEMICONDUCTOR DEVICE

CROSS REFERENCE OF THE RELATED APPLICATION

This application is based on and claims the benefit of priority from Japanese Patent Application No. 2006-283597, filed on Oct. 18, 2006; the entire contents of which are incorporated herein by reference.

BACKGROUND OF THE INVENTION

1. Field of the Invention

The present invention relates to an optical semiconductor device including an optical semiconductor element and to a method of manufacturing the optical semiconductor device.

2. Description of the Related Art

Optical semiconductor devices are used in a broad range of fields as light sources for various devices including illuminating devices, display devices, and the like. This optical semiconductor device includes an optical semiconductor element, such as a light-emitting diode (LED), a first lead portion on which the optical semiconductor element is formed and bonded so as to establish electrical connection with the optical semiconductor element, and a second lead portion electrically connected to the optical semiconductor element on the first lead portion through a wire (see JP-A No. 2006-156538 (KOKAI) and JP-A No. 2006-66670 (KOKAI), for example). A voltage is applied to the first lead portion and the second lead portion and electric power is thereby applied to the optical semiconductor element.

A light-emitting layer is formed on a first principal surface of the optical semiconductor element, and a first electrode having a smaller size than the first principal surface is formed on the light-emitting layer. This first electrode is bonded to the first lead portion by use of a bonding member, such as solder, and the optical semiconductor element is formed on a mounting surface of the first lead portion. Meanwhile, a second principal surface located on the opposite side of the first principal surface is formed with a second electrode for connecting the wire. Here, the optical semiconductor element is sealed by mold resin.

In this optical semiconductor device, since the first lead portion is formed by press working and the like, the first lead portion has a low degree of flatness. Hence, in order to achieve bonding in which a bonding material, such as solder, is sufficiently filled in a space between the optical semiconductor element and the mounting surface of the first lead portion, it is necessary to thicken a bonding layer formed by the bonding member, or alternatively, to supply an auxiliary material, such as sheet solder, in addition to a bonding material, such as the solder.

However, the degree of flatness on the mounting surface of the first lead portion varies for each optical semiconductor device, and an amount of supply of the bonding member is set for the mounting surface having a low degree of flatness. Therefore, if the mounting surface has a high degree of flatness, the surplus bonding material runs off the space between the optical semiconductor element and the mounting surface of the first lead portion and climbs up along a sidewall of the optical semiconductor element. As the optical semiconductor is separated into an anode and a cathode according to the light-emitting layer, the contact of the bonding material with the sidewall of the optical semiconductor element causes a short-circuit failure.

SUMMARY OF THE INVENTION

The object of the present invention is to provide an optical semiconductor device capable of preventing occurrence of short-circuit failure due to climbing of a bonding material along an optical semiconductor element, and to provide a method of manufacturing the optical semiconductor device.

The first aspect related to embodiments of the present invention provides an optical semiconductor device includes an optical semiconductor element, a first lead portion, and a second lead portion. The optical semiconductor device includes an optical semiconductor element having a light-emitting layer formed on a first principal surface, a first electrode being formed on the light-emitting layer and having a smaller size than the first principal surface, and a second electrode formed on a second principal surface different from the first principal surface. The first lead portion includes a bonding region to which the first electrode is bonded and which has a smaller size than the first principal surface, and a first groove portion formed on an outer peripheral region adjacent to the bonding region. The bonding region is bonded to the first electrode by use of a bonding member and the first lead portion is electrically connected to the first electrode. The second lead portion is electrically connected to the second electrode by use of a connecting member.

The second aspect related to embodiments of the present invention provides a method of manufacturing an optical semiconductor device. The method includes forming a first groove portion on an outer peripheral region adjacent to a bonding region of a first lead portion, to which a first electrode of an optical semiconductor element is to be bonded, the optical semiconductor element being to be provided on the first lead portion and being provided with a light-emitting layer formed on a first principal surface of the optical semiconductor element, the first electrode formed on the light-emitting layer and having a smaller size than the first principal surface, and a second electrode formed on a second principal surface different from the first principal surface, the bonding region being smaller than the first principal surface; bonding the first electrode to the bonding region by use of a bonding member and providing the semiconductor element on the first lead portion to electrically connect the first lead to the first electrode; and electrically connecting a second lead portion to the second electrode of the optical semiconductor element on the first lead portion by use of a connecting member.

DESCRIPTION OF THE PREFERRED EMBODIMENTS

First Embodiment

A first Embodiment of the present invention will be described with reference to FIGS. 1 to 5.

Figure 1:
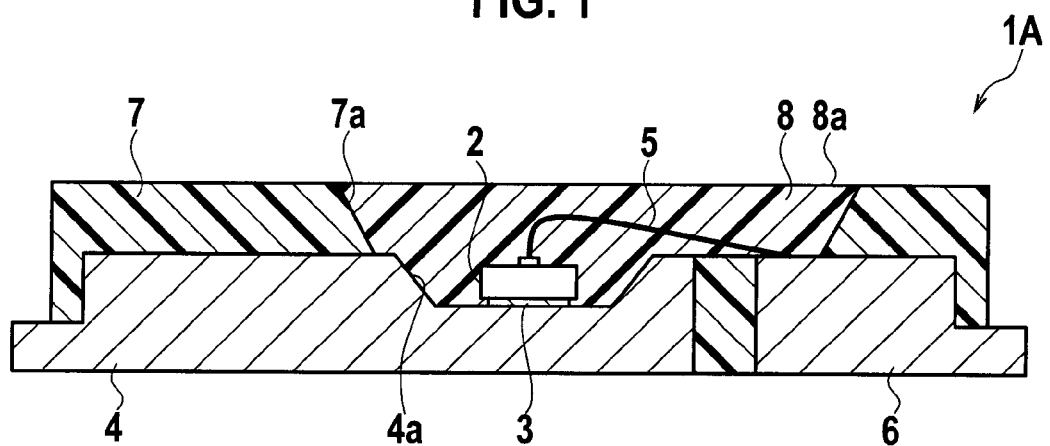
FIG. 1 is a cross-sectional view showing a schematic configuration of an optical semiconductor device according to a first Embodiment of the present invention.

As shown in FIG. 1, an optical semiconductor device 1A according to a first Embodiment of the present invention includes an optical semiconductor element 2 configured to emit light, a first lead portion 4 on which the optical semiconductor element 2 is formed and bonded through a bonding member 3 so as to establish electrical connection with the optical semiconductor element 2, a second lead portion 6 which is electrically connected to the optical semiconductor element 2 on the first lead portion 4 through a connecting member 5, a base body 7 which is a mold member that covers the first lead portion 4 and the second lead portion 6, and a translucent member 8 for sealing the optical semiconductor element 2.

Figure 2:
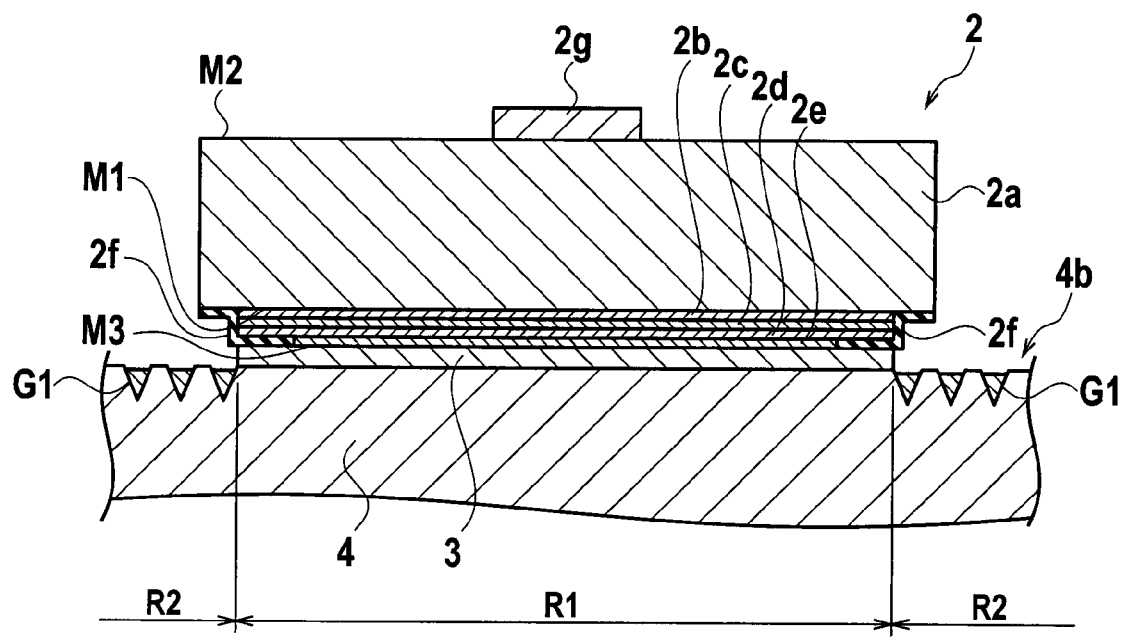
FIG. 2 is an enlarged cross-sectional view showing a bonding portion between an optical semiconductor element and a first lead portion included in the optical semiconductor device shown in FIG. 1.

As shown in FIG. 2, the optical semiconductor element 2 includes a conductive base member 2a serving as a base body, an n-type semiconductor layer 2b provided under (on) a first principal surface M1 of the conductive base member 2a, a light-emitting layer 2c formed under the n-type semiconductor layer 2b, a p-type semiconductor layer 2d formed under the light-emitting layer 2c, a first electrode 2e being formed under the p-type semiconductor layer 2d and having a smaller size than the first principal surface M1, a protective film (a passivation film) 2f having an insulation property and covering peripheries of the semiconductor layers 2b and 2d as well as the light-emitting layer 2c, and a second electrode 2g formed on a second principal surface M2 which is the opposing surface of the first principal surface M1. A light-emitting diode (LED) is used as this optical semiconductor element 2, for example.

The first lead portion 4 and the second lead portion 6 constitute a pair of lead terminals for supplying electricity to the optical semiconductor element 2. A voltage is applied to the first lead portion 4 and the second lead portion 6, and electricity is thereby supplied to the optical semiconductor element 2. In this way, the optical semiconductor element 2 emits light from the light-emitting layer 2c which is sandwiched between the n-type semiconductor layer 2b and the p-type semiconductor layer 2d.

Figure 3:
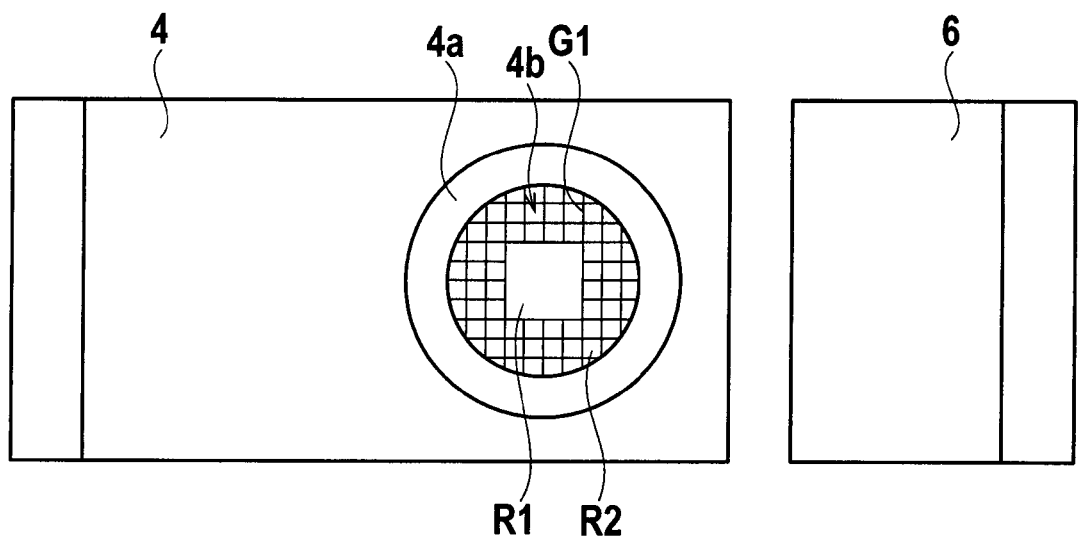
FIG. 3 is a plan view showing the first lead portion and a second lead portion included in the optical semiconductor device shown in FIG. 1.

As shown in FIG. 1, FIG. 2, and FIG. 3, the first lead portion 4 includes a concave portion 4a housing the optical semiconductor element 2, a bonding region R1 which is a region to be bonded to the first electrode 2e of the optical semiconductor element 2 and has a smaller size than the first principal surface M1, and a first groove portion 4b formed in an outer peripheral region R2 adjacent to the bonding region R1. The concave portion 4a is typically formed into a cup shape, i.e. into an inverted circular truncated cone shape.

The bonding region R1 is a surface region formed in a square shape, for example, on a bottom face of the concave portion 4a. The area of this bonding region R1 is smaller than the area of the first principal surface M1 of the optical semiconductor element 2 and is larger than the area of a bonding surface M3 of the first electrode 2e. The outer peripheral region R2 is a surface region formed on the bottom face of the concave portion 4a so as to surround the bonding region R1. The area of this outer peripheral region R2 is equal to the area subtracting the area of the bonding region R1 from the area of the bottom face of the concave portion 4a. Meanwhile, the first groove portion 4b is an aggregate of multiple grooves G1 formed throughout the outer peripheral area R2, for example, in a reticular pattern.

Here, the first electrode 2e of the optical semiconductor element 2 is bonded to the bonding region R1 of the first lead portion 4 by use of the bonding member 3 such as solder, formed on the first lead portion 4, and electrically connected to the first lead portion 4. Here, AuSn eutectic solder is used as the bonding member 3, for example. Moreover, the second electrode 2g of the optical semiconductor element 2 is electrically connected to the second lead portion 6 by use of the connecting member 5 such as a gold wire.

Here, the size of the optical semiconductor element 2 is equal to $1.0\times1.0\times0.2$ (height) $mm^3$. The area of the light-emitting layer 2c of this optical semiconductor element 2 is equal to $0.9\times0.9$ $mm^2$, and the area of the second electrode 2g is equal to $0.8\times0.8$ $mm^2$. Meanwhile, a diameter of an aperture of the concave portion 4a of the first lead portion 4 is equal to 2.5 mm, and the circular bottom face has a diameter equal to 2.0 mm and a depth equal to 0.5 mm. The area of the bonding region R1 is equal to $0.9\times0.9$ $mm^2$. The grooves G1 of the first groove portion 4b are arranged in two directions orthogonal to each other at a pitch of 0.06 mm, for example. Each of the grooves G1 has a V-shape having a depth equal to 0.01 mm and a width equal to 0.01, for example.

The base body 7 has a reflecting surface 7a for reflecting the light emitted from the optical semiconductor element 2 outward. The base body 7 is a mold member covering the first lead portion 4 and the second lead portion 6. The reflecting surface 7a is inclined so as to spread from the inside to the outside. This base body 7 is made of white molding resin, for example. Thermoplastic resin such as polyamide resin is used as the molding resin.

The translucent member 8, which is formed inside the concave portion 4a of the first lead portion 4 and a concave portion formed by the reflecting surface 7a of the base body 7, is configured to seal the optical semiconductor element 2. This translucent member 8 has an emitting surface 8a for emitting the light that is emitted from the optical semiconductor element 2. This emitting surface 8a is an exposed surface which contacts outside atmosphere, and functions as a light-extracting surface for allowing emission of the light that is emitted from the optical semiconductor element 2.

This translucent member 8 is made of a translucent resin material such as phosphor-mixed resin formed by mixing phosphor particles with resin. Silicone resin is used as the translucent resin material, for example. Here, the phosphor is a substance which converts a wavelength of the light emitted from the optical semiconductor element 2, which emits light having a wavelength longer than that of the light from the optical semiconductor element 2, for example. Phosphor designed to emit yellow light or a combination of the phosphor designed to emit yellow light and phosphor designed to emit red light is used as the phosphor herein, for instance.

In this optical semiconductor device 1A, the optical semiconductor element 2 emits light, when a voltage is applied to the first lead portion 4 and the second lead portion 6 and electricity is thereby supplied to the optical semiconductor element 2. Part of the light passes through the translucent member 8 and is directly emitted from the emitting surface 8a. Other part of the light is reflected by sidewalls of the concave portion 4a of the first lead portion 4 and the reflecting surface 7a of the base body 7 and is emitted from the emitting surface 8a. Meanwhile, other part of the light enters the phosphor contained in the translucent member 8. Accordingly, the phosphor is excited and thereby emits the light. Part of the light also passes through the translucent member 8 and is emitted from the emitting surface 8a, and other part thereof is also reflected by the sidewalls of the concave portion 4a of the first lead portion 4 and the reflecting surface 7a of the base body 7 and thereby emitted from the emitting surface 8a. In this way, the light emitted from the optical semiconductor element 2 and the light emitted from the phosphor excited by that light is mixed together and emitted from the emitting surface 8a of the translucent member 8.

Next, a method of manufacturing the optical semiconductor device 1A will be described.

Figure 4:
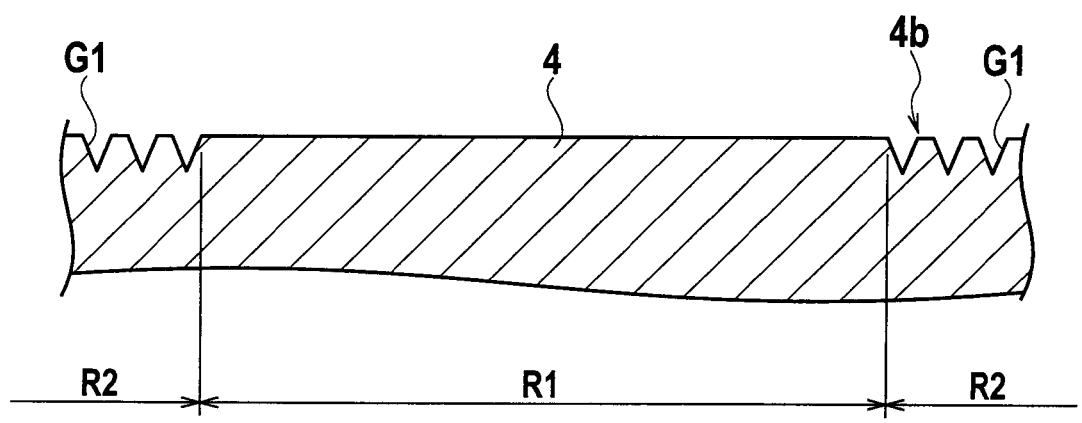
FIG. 4 is a sectional view of a first process for explaining a method of manufacturing the optical semiconductor device shown in FIG. 1.
Figure 5:
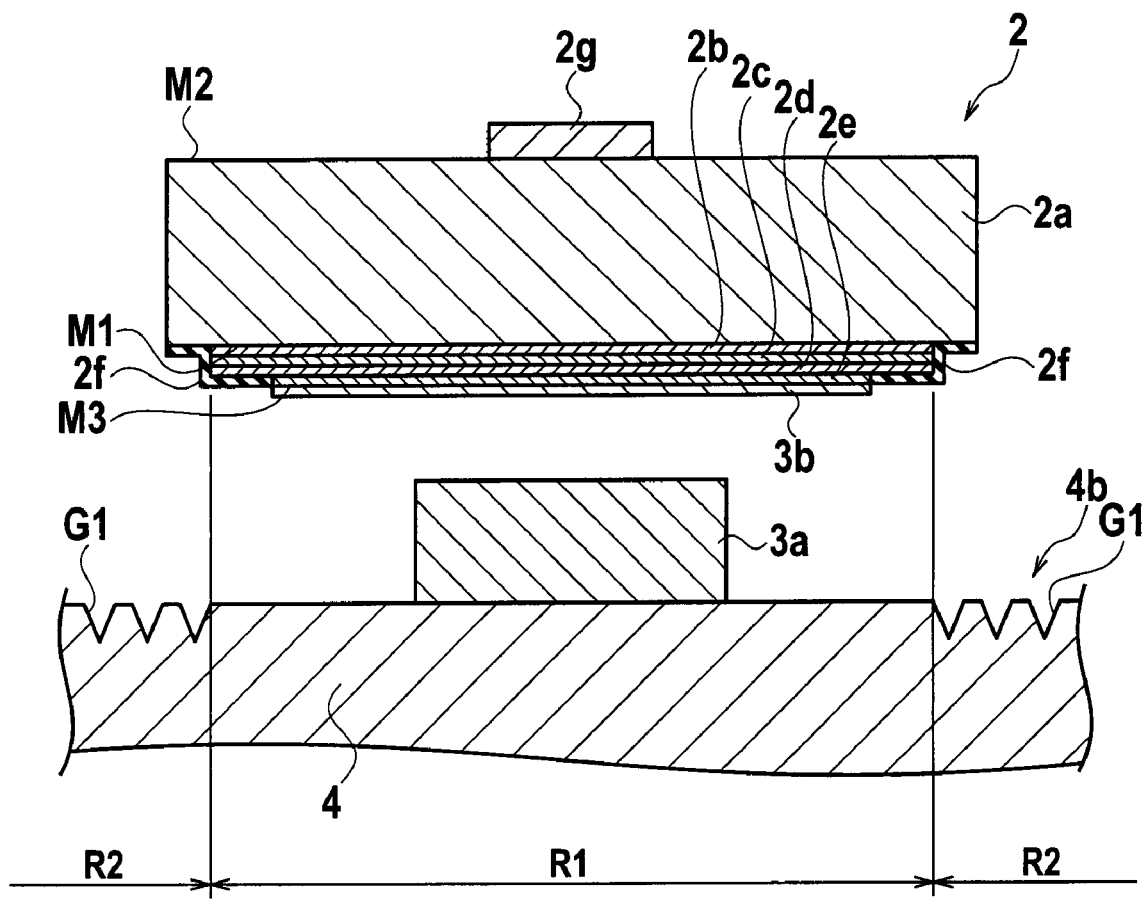
FIG. 5 is a sectional view of the second process.

In a manufacturing process of the optical semiconductor device 1A, the first lead portion 4 and the second lead portion 6 are formed in the first place, and then the first groove portion 4b is formed in the outer peripheral region R2 located adjacent to the bonding region R1 of the first lead portion 4 as shown in FIG. 4. Thereafter, the base body 7 is formed so as to cover the first lead portion 4 and the second lead portion 6 while warding off the concave portion 4a of the first lead portion 4. Then, as shown in FIG. 5, the first electrode 2e of the optical semiconductor element 2 is bonded to the bonding region R1, and the optical semiconductor element 2 is formed on the first lead portion 4. Then, the second electrode 2g of the optical semiconductor element 2 on the first lead portion 4 is electrically connected to the second lead portion 6 by use of the connecting member 5. Lastly, the optical semiconductor element 2 is sealed with the translucent member 8.

To be more precise, the first lead portion 4 and the second lead portion 6 are formed by punching a metal plate member. Thereafter, the concave portion 4a of the first lead portion 4 is formed by press working. Then, the first groove portion 4b is formed in the outer peripheral region R2 by forming the grooves G1 in the outer peripheral region R2 on the bottom face of the concave portion 4a as shown in FIG. 4, and the bottom face of the concave portion 4a is pressed in order to obtain a higher degree of flatness. In this way, the first groove portion 4b is formed in the outer peripheral region R2 located adjacent to the bonding region R1 on the bottom face of the concave portion 4a. At this time, the bonding region R1 is formed larger than the bonding surface M3 of the first electrode 2e of the optical semiconductor element 2 and smaller than the first principal M1 of the optical semiconductor element 2.

Next, the first lead portion 4 and the second lead portion 6 are placed in a mold configured to form the base body 7 while having the first lead portion 4 and the second lead portion 6 in predetermined positions. Then, the base body 7 is formed with white mold resin by using an injection molding method, for example. Thermoplastic resins such as polyphthalamide are used as the while mold resin.

Then, as shown in FIG. 5, a solder sheet 3a is placed in the center of the bonding region R1 of the first lead portion 4. This solder sheet 3a is made of AuSn eutectic solder, for example. The size of the solder sheet 3a is equal to 300×300×25 (thickness) $\mu m^3$, for example. Meanwhile, as shown in FIG. 5, prior to placement of the optical semiconductor element 2 on the first lead portion 4, a solder film 3b is formed on the first electrode 2e of the optical semiconductor element 2 in advance. This solder film 3b is made of AuSn eutectic solder, for example. The thickness of the solder film 3b is equal to 2 $\mu m$, for example.

The bonding member 3 is provided by the solder sheet 3a and the solder film 3b. In other words, the solder sheet 3a and the solder film 3b are fused together to form the bonding member 3. In particular, the solder sheet is used in order to fill the solder thoroughly in the space between the optical semiconductor element 2 and the first lead portion 4 so as to deal with the first lead portion 4 having a low degree of flatness and a high degree of surface roughness. Hence, the amount of solder provided becomes larger than an adequate amount of solder necessary for bonding.

Then, the first lead portion 4 is heated up to a temperature (such as 320° C.) higher than the melting point of the AuSn eutectic solder (280° C.) under a reducing atmosphere containing $N_2$ (90%) and $H_2$ (10%), and the optical semiconductor element 2 is formed on the bonding region R1 of the first lead portion 4 through the solder sheet 3a by use of a die mounter (not shown). Accordingly, the first electrode 2e of the optical semiconductor element 2 is bonded to the bonding region R1 of the first lead portion 4, and the optical semiconductor element 2 is formed on the bottom face of the concave portion 4a of the first lead portion 4.

At this time, even when the fused solder runs off the space between the optical semiconductor element 2 and the first lead portion 4, the surplus solder that runs off will spread over the respective grooves G1 of the first groove portion 4b by a capillary phenomenon; therefore, it will not climb up along a sidewall of the optical semiconductor element 2. In this way, it is possible to prevent the solder from climbing up along the sidewall of the optical semiconductor element 2 when the optical semiconductor element 2 is bonded to the first lead portion 4 by use of the bonding member 3.

Here, the optical semiconductor element 2 formed on the first lead portion 4 is bonded onto the first lead portion 4 by applying a load of 0.5 N for 100 ms. Scrubbing may be performed after the pressure application in order to ensure fine adhesion between the solder film 3b on the optical semiconductor element 2 and the solder sheet 3a. Such a scrubbing treatment is performed by causing micromotion of a collet on which the first lead portion 4 is formed. The scrubbing treatment causes micromotion of the collet so that it moves along a quadrilateral-shaped path. In this case, a side of the quadrangle (a stroke) is 200 $\mu m$, and a traveling speed of the collet is 100 $\mu m/s$, for example.

Here, a high output type optical semiconductor element 2, which is capable of obtaining an optical flux of 45 $\mu m$ when an electric current of 350 mA is applied, is used as the optical semiconductor element 2, for example. The conductive base member 2a of this optical semiconductor element 2 is made of SiC (silicon carbide), for example, and the light-emitting layer 2c is a light-emitting layer designed to emit blue light, for example. Meanwhile, the first lead portion 4 and the second lead portion 6 are formed with a copper plate with a thickness of 1.5 mm. Surfaces of the first lead portion 4 and the second lead portion 6 are coated by nickel with a thickness of 1 $\mu m$ and silver with a thickness of 1 $\mu m$, respectively. Meanwhile, a thickness of the bonding member 3 is to be 2 $\mu m$. The size of the base body 7 is 8.0×5.0×2.5 (height) $mm^3$.

Then, the second electrode 2g of the optical semiconductor element 2 is electrically connected to the second lead portion 6 by use of the connecting member 5 such as a gold wire. Lastly, silicon resin is filled in the concave portion 4a of the first lead portion 4 and a concave portion formed by the reflecting surface 7a of the base body 7 to seal the optical semiconductor element 2. In this way, the translucent member 8 made of silicone resin is provided on the base body 7, and the optical semiconductor device 1A is completed as shown in FIG. 1.

For the silicone resin herein, silicone resin mixed with a phosphor having a diameter in a range between 5 and 20 μm at a concentration in a range between 5 and 10 wt % is used. The phosphor, for example, is a SOSE type phosphor consisting of $(Sr,Ba)_2SiO_4:Eu^{2+}$, which converts blue light having a wavelength of 460 nm into yellow light having a wavelength of 570 mm. Hence, the optical semiconductor device 1A emits blue and yellow light, and these light factors are blended to produce visually white light.

Here, in this embodiment, the solder sheet 3a is used for dealing with a shortage of the amount of solder due to fluctuation in the degree of flatness and surface roughness of the mounting surface of the first lead portion 4. However, if it is possible to supply a sufficient amount of solder by increasing the thickness of the solder film 3b, it is not necessary to supply the solder by use of the solder sheet 3a. Even if the thickness of the solder film 3b is increased, the surplus solder running off the space between the optical semiconductor element 2 and the first lead portion 4 spreads over the respective grooves G1 of the first groove portion 4b by the capillary phenomenon, and thereby does not climb up along the sidewall of the optical semiconductor element 2. Hence, it becomes possible to prevent the solder from climbing up along the sidewall of the optical semiconductor element 2 when the optical semiconductor element 2 is bonded to the first lead portion 4 by use of the bonding member 3.

As described above, according to the first Embodiment of the present invention, by forming the first groove portion 4b in the outer peripheral region R2 adjacent to the bonding region R1 of the first lead portion 4, the surplus bonding member 3 running off the space between the optical semiconductor element 2 and the first lead portion 4 when the optical semiconductor element 2 is bonded to the first lead portion 4 by use of the bonding member 3 spreads over the respective grooves G1 of the first groove portion 4b, and thereby no bonding member 3 climbs up along the sidewall of the optical semiconductor element 2. In this way, it becomes possible to prevent the bonding member 3 from climbing up along the sidewall of the optical semiconductor element 2; thus, it is possible to prevent occurrence of short-circuit failure due to such climbing of the bonding member 3. In particular, with the bonding region R1 formed in a smaller size than the first principal surface M1 of the optical semiconductor element 2, and respective grooves G1 also formed in the region facing the first principal surface M1, the surplus bonding member 3 is to flow into the respective grooves G1 before reaching the sidewall of the optical semiconductor element 2. Hence, it is possible to surely prevent the bonding member 3 from climbing up along the sidewall of the optical semiconductor element 2.

Moreover, as the bonding region R1 is larger than the bonding surface M3 of the first electrode 2e, no grooves G1 are formed in the region facing the bonding surface M3 of the first electrode 2e. Hence, it is possible to improve adhesion of the optical semiconductor element 2 to the first lead portion 4. As a result, it becomes possible to prevent detachment of the optical semiconductor element 2 from the first lead portion 4, and thereby to improve component reliability of the optical semiconductor device 1A.

Second Embodiment

A second Embodiment of the present invention will be described with reference to FIGS. 6 and 7. In the second Embodiment of the present invention, parts which are different in the first Embodiment will be explained. In the second Embodiment, the same constituents as those described in the first Embodiment will be assigned by the same reference signs as in the first Embodiment and duplicate explanations thereof will be omitted (the same applies to other Embodiments).

Figure 6:
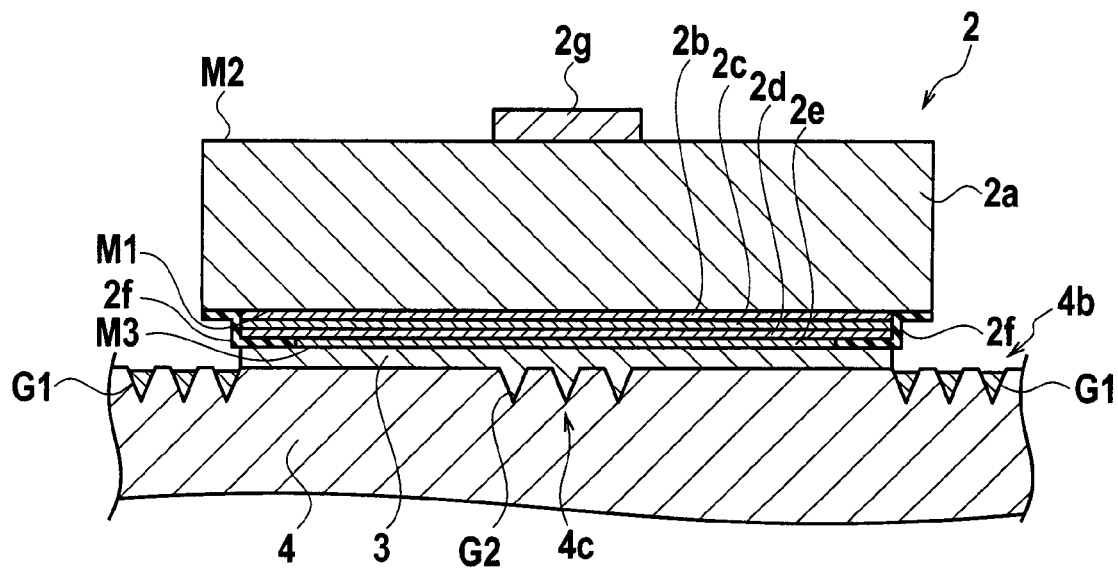
FIG. 6 is an enlarged cross-sectional view showing a bonding portion between an optical semiconductor element and a first lead portion included in an optical semiconductor device according to a second Embodiment of the present invention.
Figure 7:
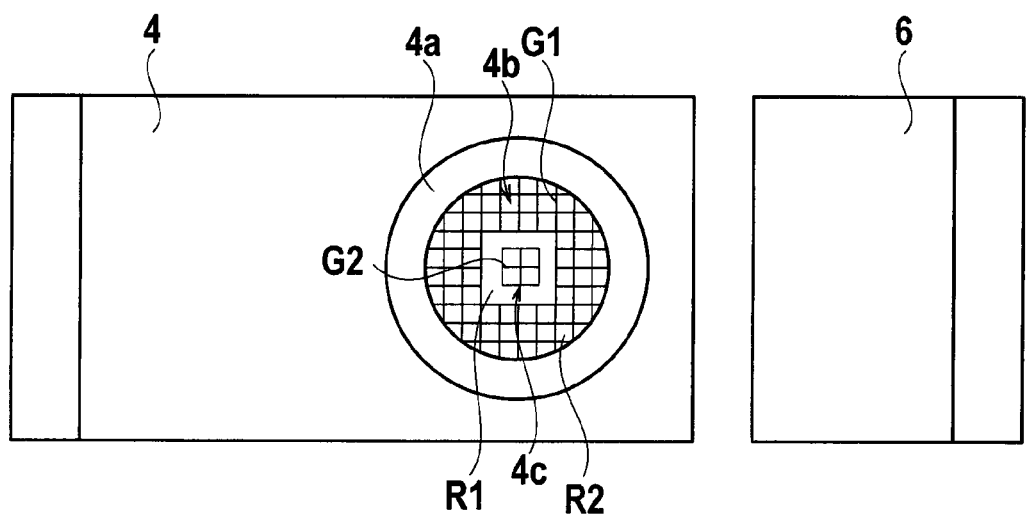
FIG. 7 is a plan view showing a first lead portion and a second lead portion included in the optical semiconductor device according to the second Embodiment of the present invention.

As shown in FIGS. 6 and 7, in the second Embodiment of the present invention, the first lead portion 4 includes a second groove portion 4c which is formed in the bonding region R1 away from the first groove portion 4b. Therefore, there is a flat portion between the first groove portion 4b and the second groove portion 4c. The second groove portion 4c is formed within the bonding region R1 so that the respective grooves G2 are not communicated with the respective grooves G1 of the first groove portion 4b. Here, the area of the second groove portion 4c is equal to 0.5×0.5 $mm^2$, for example.

The manufacturing process of the optical semiconductor device 1A includes a process of forming the second groove portion 4c in the bonding region R1 away from the first groove portion 4b in addition to the manufacturing process of the first Embodiment. To be more precise, after forming the concave portion 4a of the first lead portion 4 by press working, the first groove portion 4b is formed in the outer peripheral region R2 by processing the grooves G1 in the outer peripheral region R2 on the bottom surface of the concave portion 4a. Simultaneously, the second groove portion 4c is formed in the bonding region R1 by processing the grooves G2 in the bonding region R1 on the bottom surface of the concave portion 4a. Lastly, the bottom surface of the concave portion 4a is subjected to pressing in order to obtain a high degree of flatness. The following manufacturing processes are similar to those in the first Embodiment.

As described above, in the second Embodiment of the present invention, it is possible to obtain a similar effect to that in the first Embodiment. Furthermore, by forming the second groove portion 4c away from the first groove portion 4b within the bonding region R1 of the first lead portion 4, it is possible to prevent the fused solder sheet 3a from spreading when the solder sheet 3a is supplied as the bonding member 3. In this way, since a sufficient amount of solder remains in the space between the optical semiconductor element 2 and the first lead portion 4, it is possible to suppress occurrence of bonding failure between the optical semiconductor element 2 and the first lead portion 4. As a result, it becomes possible to prevent detachment of the optical semiconductor element 2 from the first lead portion 4, and thereby to improve component reliability of the optical semiconductor device 1A.

For a method to form the first groove portion 4b and the second groove portion 4c, a method to form the first groove portion 4b and the second groove portion 4c simultaneously may be used, in which multiple punches for fabricating grooves in line are hit on the bottom surface of the concave portion 4a once, and then the punches are hit once again after turning them, for example, 90° processes. Using this method, it is possible to simplify the arrangement of the respective punches compared to a method using multiple punches for fabricating grooves arranged in a reticular pattern. Hence, tool maintain will be easier. In addition, it is possible to reduce the force required for making punches; therefore, it is also possible to prevent intersections of the respective grooves G1 and G2 from being crushed.

Third Embodiment

A third Embodiment of the present invention will be described with reference to FIGS. 8 and 9. In the third Embodiment of the present invention, parts which are different in the first Embodiment will be explained.

Figure 8:
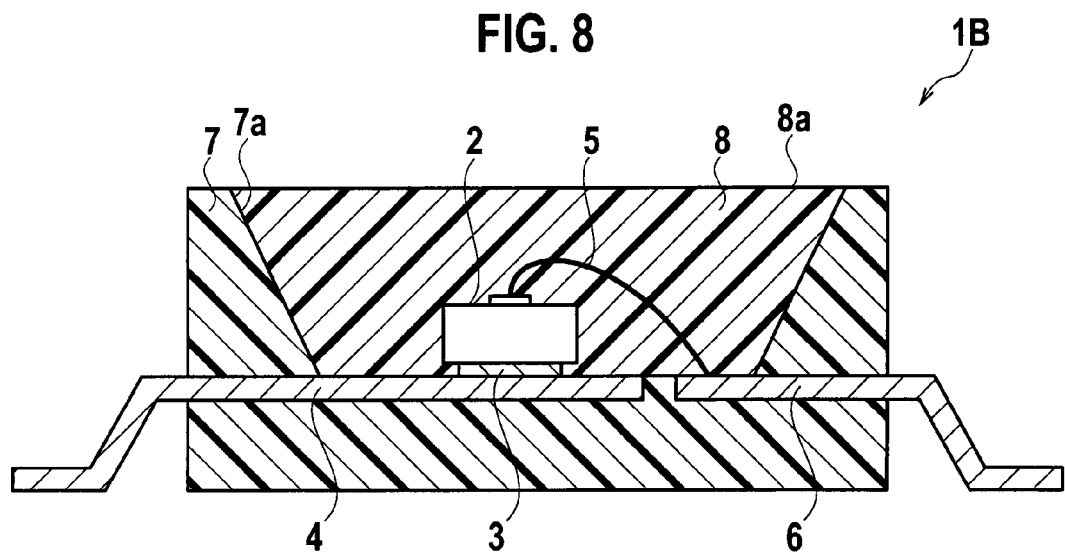
FIG. 8 is a cross-sectional view showing a schematic configuration of an optical semiconductor device according to a third Embodiment of the present invention.
Figure 9:
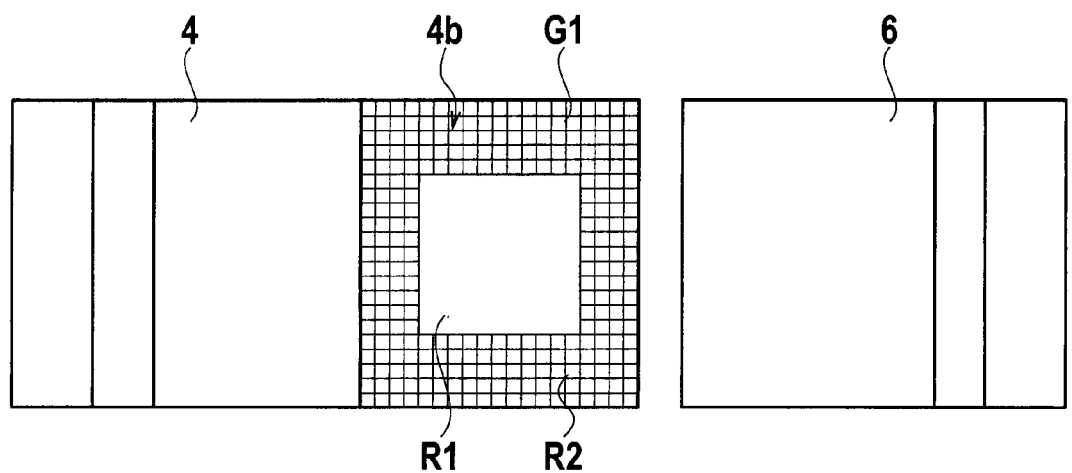
FIG. 9 is a plan view showing a first lead portion and a second lead portion included in the optical semiconductor device shown in FIG. 8.

As shown in FIG. 8 and FIG. 9, in an optical semiconductor device 1B related to the third Embodiment of the present invention, the first lead portion 4 is a flat flame not including the concave portion 4a, in which the outer peripheral region R2 of the first lead portion 4 is formed in a frame shape so as to surround the bonding region R1.

As described above, in the configuration of the third Embodiment of the present invention, it is also possible to obtain a similar effect to that in the first Embodiment.

Other Embodiments

It is to be noted that the present invention is not limited to the above-described Embodiments and various other modifications are possible without departing from the scope of the invention.

For example, various numerical values are cited in the above-described embodiments. However, the numerical values are merely exemplary; thus, the present invention is not limited only to those numerical values.

Meanwhile, the bonding region R1 is formed into a square shape in the above-described embodiments. However, the invention is also not limited only to this configuration. For example, the bonding region R1 may be formed in a circular shape, and the shape is not limited. Similarly, the shape of the outer peripheral region R2 is not limited to the configuration of the Embodiments.

Meanwhile, the bonding region R1 is formed larger than the first electrode 2e in the above-described Embodiments. However, the present invention is not limited to this configuration. For example, the bonding region R1 may be formed smaller than the first electrode 2e.

Meanwhile, in the above-described Embodiments, the grooves G1 are formed in two directions orthogonal to each other as the first groove portion 4b. However, the present invention is not limited to this configuration. For example, the grooves G1 may be formed in one direction or in three or more directions, or such that they are not orthogonally crossed each other.

Meanwhile, in the above-described Embodiments, individual grooves G1 are formed into a V-shape. However, the present invention is not limited to this configuration. For example, the individual grooves may be formed into semicircular or rectangular shapes.

Lastly, in the above-described Embodiments, the surface on the opposite side of the first principal surface M1 is used as the second principal surface M2 for mounting the second electrode 2g. However, the present invention is not limited to this configuration. For example, one of sidewalls of the conductive base member 2a may be used as the second principal surface M2. It is only necessary to use a surface other than the first principal surface M1 as the second principal surface M2.

What is claimed is:

1. An optical semiconductor device comprising:
an optical semiconductor element including a light-emitting layer formed on a first principal surface, a first electrode formed on the light-emitting layer and having a smaller size than the first principal surface, and a second electrode formed on a second principal surface different from the first principal surface;
a first lead portion including a bonding region to which the first electrode is bonded and which has a smaller size than the first principal surface and all of which is flat, and a first groove portion formed on an outer peripheral region adjacent to the bonding region, the first lead portion being electrically connected to the first electrode bonded to the bonding region by use of a bonding member; and
a second lead portion electrically connected to the second electrode by use of a connecting member,
wherein at least one part of the first groove portion is formed on the outer peripheral region within the bounds of the optical semiconductor element and outside of the bonding region, and
wherein the first electrode has a smaller size than the bonding region.

2. The optical semiconductor device according to claim 1, wherein the bonding region has a larger size than a bonding surface of the first electrode.

3. The optical semiconductor device according to claim 1, wherein the bonding region does not have a groove.

4. A method of manufacturing an optical semiconductor device comprising:
forming a first groove portion on an outer peripheral region adjacent to a bonding region of a first lead portion, to which region a first electrode of an optical semiconductor element is to be bonded, the optical semiconductor element being to be provided on the first lead portion and being provided with a light-emitting layer formed on a first principal surface of the optical semiconductor element, the first electrode formed on the light-emitting layer and having a smaller size than the first principal surface, and a second electrode formed on a second principal surface different from the first principal surface, the bonding region being smaller than the first principal surface and being flat;
bonding the first electrode to the bonding region by use of a bonding member and providing the semiconductor element on the first lead portion to electrically connect the first lead portion to the first electrode; and
electrically connecting a second lead portion to the second electrode of the optical semiconductor element on the first lead portion by use of a connecting member,
wherein at least one part of the first groove portion is formed on the outer peripheral region within the bounds of the optical semiconductor element and outside of the bonding region, and
wherein the first electrode has a smaller size than the bonding region.

5. The method of manufacturing an optical semiconductor device according to claim 4,
wherein the bonding region is formed larger than a bonding surface of the first electrode.

6. The method of manufacturing an optical semiconductor device according to claim 4,
wherein the bonding region is formed so that the bonding region does not have a groove.

7. An optical semiconductor device comprising:
an optical semiconductor element including a light-emitting layer formed on a first principal surface, a first electrode formed on the light-emitting layer and having a smaller size than the first principal surface, and a second electrode formed on a second principal surface different from the first principal surface;
a first lead portion including a bonding region to which the first electrode is bonded and which has a smaller size than the first principal surface, and a first groove portion formed on an outer peripheral region adjacent to the bonding region, and a second groove portion formed within the bonding region, the first lead portion being electrically connected to the first electrode bonded to the bonding region by use of a bonding member;

a second lead portion electrically connected to the second electrode by use of a connecting member; and a flat portion disposed on the first lead portion between the first groove portion and the second groove portion, wherein the first electrode has a smaller size than the bonding region, and at least one part of the first groove portion is formed on the outer peripheral region within the optical semiconductor element and outside of the bonding region.

8. A method of manufacturing an optical semiconductor device comprising:

forming a first groove portion on an outer peripheral region adjacent to a bonding region of a first lead portion, to which region a first electrode of an optical semiconductor element is to be bonded, the optical semiconductor element being provided on the first lead portion and being provided with a light-emitting layer formed on a first principal surface of the optical semiconductor element, the first electrode formed on the light-emitting layer and having a smaller size than the first principal surface, and a second electrode formed on a second principal surface different from the first principal surface, the bonding region being smaller than the first principal surface;

forming a second groove portion within the bonding region so that a flat portion disposed on the first lead portion between the first groove portion and the second groove portion;

bonding the first electrode to the bonding region by use of a bonding member and providing the semiconductor element on the first lead portion to electrically connect the first lead portion to the first electrode; and electrically connecting a second lead portion to the second electrode of the optical semiconductor element on the first lead portion by use of a connecting member, wherein the first electrode has a smaller size than the bonding region, and at least one part of the first groove portion is formed on the outer peripheral region within the optical semiconductor element and outside of the bonding region.

9. The optical semiconductor device according to claim 1, wherein the first groove portion has a groove filled with material of the bonding member.

10. The method according to claim 4, wherein the first groove portion has a groove filled with material of the bonding member.

11. The optical semiconductor device according to claim 1, wherein an innermost groove of the first groove portion is formed entirely within the bounds of the optical semiconductor element.

12. The method according to claim 4, wherein an innermost groove of the first groove portion is formed entirely within the bounds of the optical semiconductor element.

* * * * *